(12) United States Patent
Du et al.

(10) Patent No.: US 12,557,492 B2
(45) Date of Patent: Feb. 17, 2026

(54) DISPLAY PANEL INCLUDING ELECTRICAL CONNECTION PATTERNS AND METHOD FOR MANUFACTURING THE SAME, AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Lili Du, Beijing (CN); Xiaofeng Yang, Beijing (CN); Zhongguo Xu, Beijing (CN); Mingwen Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 704 days.

(21) Appl. No.: 17/914,867

(22) PCT Filed: Nov. 23, 2021

(86) PCT No.: PCT/CN2021/132542
§ 371 (c)(1),
(2) Date: Sep. 27, 2022

(87) PCT Pub. No.: WO2022/237119
PCT Pub. Date: Nov. 17, 2022

(65) Prior Publication Data
US 2024/0224638 A1   Jul. 4, 2024

(30) Foreign Application Priority Data

May 13, 2021 (CN) .......................... 202110523452.8

(51) Int. Cl.
*H10K 59/131* (2023.01)
*H10K 59/12* (2023.01)

(52) U.S. Cl.
CPC ....... *H10K 59/131* (2023.02); *H10K 59/1201* (2023.02)

(58) Field of Classification Search
CPC .. H10K 59/131; H10K 59/1201; H10K 59/65; G09F 9/30; G09G 3/30
(Continued)

(56) References Cited

U.S. PATENT DOCUMENTS

2008/0079005 A1* 4/2008 Tseng ................... H10D 86/481
345/82
2015/0171118 A1 6/2015 Shim et al.
(Continued)

FOREIGN PATENT DOCUMENTS

CN 109300951 A 2/2019
CN 110632781 A 12/2019
(Continued)

OTHER PUBLICATIONS

Notification to Grant Patent Right for Invention for Chinese Patent Application No. 202110523452.8 issued by the Chinese Patent Office on Oct. 19, 2022.

*Primary Examiner* — Norman D Richards
*Assistant Examiner* — Laura M Dykes
(74) *Attorney, Agent, or Firm* — XSENSUS LLP

(57) ABSTRACT

A display panel includes: a substrate, a plurality of groups of electrical connection patterns and a plurality of insulating layers. Each group of electrical connection patterns include at least three conductive pattern layers that are coupled to each other. Every two adjacent conductive pattern layers are provided with an insulating layer therebetween. An insulating layer between the first conductive pattern layer and the second conductive pattern layer is provided with a first via hole extending through the insulating layer, and the second conductive pattern layer and the first conductive pattern layer are coupled through the first via hole. Multiple insulating layers between the first conductive pattern layer and the third conductive pattern layer are provided with a second via hole extending through the multiple insulating layers, and the first conductive pattern layer and the third conductive pattern layer are coupled through the second via hole.

18 Claims, 11 Drawing Sheets

(58) Field of Classification Search
USPC .......................................................... 257/88
See application file for complete search history.

(56) References Cited

U.S. PATENT DOCUMENTS

| | | | |
|---|---|---|---|
| 2021/0193758 A1* | 6/2021 | Choi | .................... H10K 59/123 |
| 2022/0102466 A1 | 3/2022 | Qiu et al. | |
| 2022/0208866 A1* | 6/2022 | Park | .................... H10K 59/121 |
| 2022/0320146 A1 | 10/2022 | Huang et al. | |

FOREIGN PATENT DOCUMENTS

| | | |
|---|---|---|
| CN | 210429820 U | 4/2020 |
| CN | 111261684 A | 6/2020 |
| CN | 111403468 A | 7/2020 |
| CN | 111477676 A | 7/2020 |
| CN | 111725287 A | 9/2020 |
| CN | 111769148 A | 10/2020 |
| CN | 112151696 A | 12/2020 |
| CN | 113270036 A | 8/2021 |
| JP | 2020-43249 A | 3/2020 |
| KR | 10-2015-0069386 A | 6/2015 |
| WO | 2020228205 A1 | 11/2020 |

\* cited by examiner (a) a first part of light-emitting devices use transparent lines (b) a second part of light-emitting devices use transparent lines (c) a third part of light-emitting devices use transparent lines

DISPLAY PANEL INCLUDING ELECTRICAL CONNECTION PATTERNS AND METHOD FOR MANUFACTURING THE SAME, AND DISPLAY APPARATUS

CROSS-REFERENCE TO RELATED APPLICATIONS

This application a national phase entry under 35 USC 371 of International Patent Application No. PCT/CN2021/132542, filed on Nov. 23, 2021, which claims priority to Chinese Patent Application No. 202110523452.8, filed on May 13, 2021, which are incorporated herein by reference in their entirety.

TECHNICAL FIELD

The present disclosure relates to the field of display technologies, and in particular, to a display panel and a method for manufacturing the same, and a display apparatus.

BACKGROUND

At present, extremely narrow bezels and even full-screen displays have become a new trend in the development of display products. As screen-to-body ratios (a screen-to-body ratio being a ratio of the screen area to the whole machine area) of a plurality of high-end mobile phones have gradually and steadily increased, the full screens have become the current trend.

SUMMARY

In an aspect, a display panel is provided. The display panel includes: a substrate, a plurality of groups of electrical connection patterns disposed on the substrate, and a plurality of insulating layers. Each group of electrical connection patterns include at least three conductive pattern layers that are coupled to each other. The at least three conductive pattern layers include a first conductive pattern layer, a second conductive pattern layer and a third conductive pattern layer that are arranged sequentially in a direction proximate to the substrate, and every two adjacent conductive pattern layers are provided with an insulating layer in the plurality of insulating layers therebetween. An orthographic projection of the first conductive pattern layer on the substrate and an orthographic projection of the second conductive pattern layer on the substrate have a first overlapping region. An insulating layer located between the first conductive pattern layer and the second conductive pattern layer is provided with a first via hole extending through the insulating layer in the first overlapping region, and the second conductive pattern layer and the first conductive pattern layer are coupled through the first via hole. An orthographic projection of the third conductive pattern layer on the substrate and the orthographic projection of the first conductive pattern layer on the substrate have a second overlapping region, and each conductive pattern layer between the first conductive pattern layer and the third conductive pattern layer is outside the second overlapping region. Multiple insulating layers located between the first conductive pattern layer and the third conductive pattern layer are provided with a second via hole extending through the multiple insulating layers in the second overlapping region, and the first conductive pattern layer and the third conductive pattern layer are coupled through the second via hole.

In some embodiments, the at least three conductive pattern layers further include a fourth conductive pattern layer. The fourth conductive pattern layer is located between the second conductive pattern layer and the third conductive pattern layer, and the fourth conductive pattern layer is coupled to any conductive pattern layer except the fourth conductive pattern layer in the at least three conductive pattern layers.

In some embodiments, the at least three conductive pattern layers further include at least two conductive pattern layers located between the second conductive pattern layer and the third conductive pattern layer. One of the at least two conductive pattern layers is coupled to a conductive pattern layer except the at least two conductive pattern layers in the at least three conductive pattern layers, and another of the at least two conductive pattern layers is coupled to another conductive pattern layer except the at least two conductive pattern layers in the at least three conductive pattern layers.

In some embodiments, the display panel has a display region, the display region includes a first display region and a second display region, and a light transmittance of the first display region is greater than a light transmittance of the second display region. The display panel further includes a plurality of first light-emitting devices disposed on the substrate and located in the first display region, and a plurality of pixel driving circuits disposed on the substrate and located in the second display region. Each first light-emitting device is coupled to a pixel driving circuit in the plurality of pixel driving circuits through a group of electrical connection patterns.

In some embodiments, each conductive pattern layer in each group of electrical connection patterns is a transparent conductive layer. One of the at least three conductive pattern layers is a transparent line located in both the first display region and the second display region, and remaining conductive pattern layers except the transparent line in each group of electrical connection patterns are each located in the first display region or in the second display region.

In some embodiments, the display panel further includes a plurality of second light-emitting devices disposed on the substrate and located in the second display region. Each second light-emitting device is coupled to a pixel driving circuit in the plurality of pixel driving circuits through a group of electrical connection patterns located in the second display region.

In some embodiments, each first light-emitting device includes a first electrode, a light-emitting layer and a second electrode that are sequentially arranged in a direction away from the substrate.

In some embodiments, each group of electrical connection patterns further include a fifth conductive pattern layer; the fifth conductive pattern layer is a conductive pattern layer farthest from the substrate in the at least three conductive pattern layers, and the fifth conductive pattern layer in each group of electrical connection patterns is located in the first display region and serves as a first electrode of a first light-emitting device. Each group of electrical connection patterns are coupled to a pixel driving circuit through any conductive pattern layer located in the second display region.

In some embodiments, each group of electrical connection patterns are coupled to a first electrode of a first light-emitting device through any conductive pattern layer located in the first display region, and coupled to a pixel driving circuit through any conductive pattern layer located in the second display region.

In another aspect, a display apparatus is provided. The display apparatus includes the display panel described above.

In some embodiments, the display panel has a display region, and the display region includes a first display region and a second display region. The display apparatus further includes a photosensitive element. The photosensitive element is disposed at a position of the display panel corresponding to the first display region and located on a side of the display panel facing away from a light-exiting surface of the display panel, and the photosensitive element includes a photosensitive portion that faces the light-exiting surface of the display panel.

In some embodiments, the display panel is provided with a hole on a back of the display panel and at a position of the display panel corresponding to the first display region, and the photosensitive element is disposed in the hole.

In some embodiments, the photosensitive element includes a camera.

In yet another aspect, a method for manufacturing the display panel as described above is provided, and the method includes:

forming the plurality of groups of electrical connection patterns and the plurality of insulating layers on the substrate, which includes:

forming the at least three conductive pattern layers including the third conductive pattern layer, the second conductive pattern layer and the first conductive pattern layer sequentially on the substrate, and forming the insulating layer between every two adjacent conductive pattern layers on the substrate; the orthographic projection of the second conductive pattern layer on the substrate and the orthographic projection of the first conductive pattern layer on the substrate having the first overlapping region, the orthographic projection of the third conductive pattern layer on the substrate and the orthographic projection of the first conductive pattern layer on the substrate having the second overlapping region, and each conductive pattern layer located between the third conductive pattern layer and the first conductive pattern layer being outside the second overlapping region; and through a same patterning process, forming the first via hole extending through the insulating layer and located in the first overlapping region in the insulating layer between the first conductive pattern layer and the second conductive pattern layer, and the second via hole extending through the multiple insulating layers and located in the second overlapping region in the multiple insulating layers between the first conductive pattern layer and the third conductive pattern layer, so that the first conductive layer is coupled to the second conductive pattern layer through the first via hole, and the first conductive pattern layer is coupled to the third conductive pattern layer through the second via hole.

In some embodiments, the display panel has a display region, and the display region includes a first display region and a second display region. Forming the at least three conductive pattern layers including the third conductive pattern layer, the second conductive pattern layer, and the first conductive pattern layer sequentially on the substrate includes: forming a transparent line in both the first display region and the second display region, the transparent line being any of the at least three conductive pattern layers, and forming remaining conductive pattern layers except the transparent line in the first display region or in the second display region.

In some embodiments, through the same patterning process, forming the first via hole in the insulating layer between the first conductive pattern layer and the second conductive pattern layer, and the second via hole in the multiple insulating layers between the first conductive pattern layer and the third conductive pattern layer, includes: after forming the insulating layer between the second conductive pattern layer and the first conductive pattern layer, through the same patterning process, forming the first via hole in the insulating layer between the first conductive pattern layer and the second conductive pattern layer, and the second via hole in the multiple insulating layers between the first conductive pattern layer and the third conductive pattern layer.

In some embodiments, forming the plurality of groups of electrical connection patterns on the substrate, includes: forming the plurality of groups of electrical connection patterns on the substrate on which a plurality of pixel driving circuits are formed.

In some embodiments, the display panel has a display region, and the display region includes a first display region and a second display region. The method further includes: forming a first light-emitting device in the first display region and on a side of each group of electrical connection patterns away from the substrate, the first light-emitting device being coupled to a corresponding pixel driving circuit in the plurality of pixel driving circuits through the group of electrical connection patterns.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these accompanying drawings. In addition, the accompanying drawings in the following description may be regarded as schematic diagrams, but are not limitations on actual sizes of products, actual processes of methods and actual timings of signals involved in the embodiments of the present disclosure.

DETAILED DESCRIPTION

Figure 1:
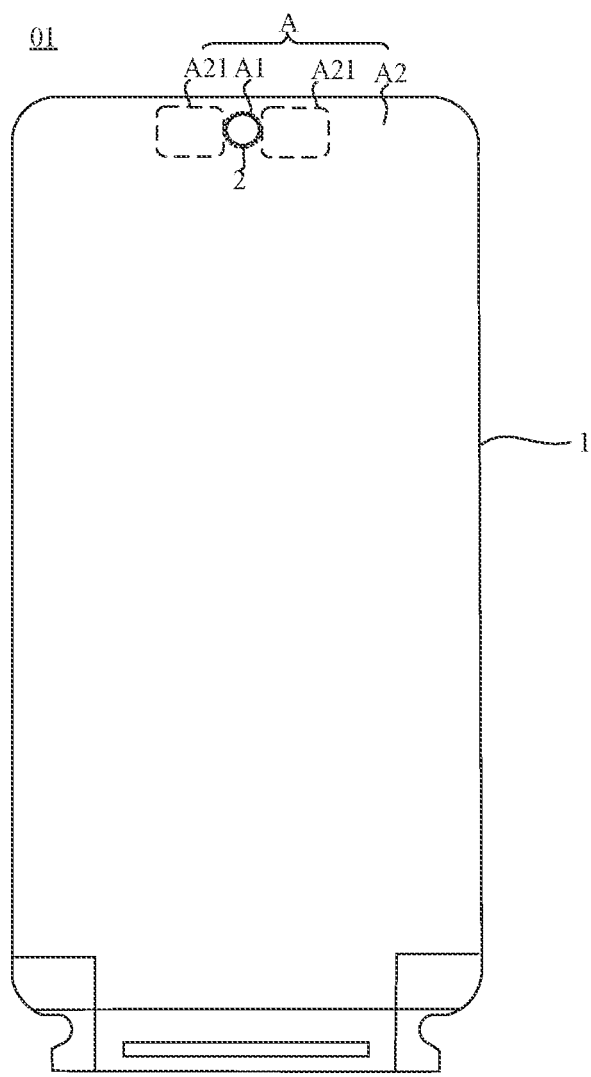
FIG. 1 is a top view showing a structure of a display apparatus, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example". "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The phrase "applicable to" or "configured to" as used herein means an open and inclusive expression, which does not exclude devices that are applicable to or configured to perform additional tasks or steps.

In addition, the use of the phase "based on" is meant to be open and inclusive, since a process, step, calculation or other action that is "based on" one or more of the stated conditions or values may, in practice, be based on additional conditions or value exceeding those stated.

As used herein, the term "about" or "approximately" includes a stated value and an average value within an acceptable range of deviation of a specific value. The acceptable range of deviation is determined by a person of ordinary skill in the art in view of the measurement in question and errors associated with the measurement of a particular quantity (i.e., limitations of the measurement system).

Exemplary embodiments are described herein with reference to sectional views and/or plan views as idealized exemplary drawings. In the accompanying drawings, thicknesses of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in a device, and are not intended to limit the scope of the exemplary embodiments.

The most critical problem for a full screen is how to deal with a front camera. In order to achieve a high screen-to-body ratio, notch screens, water drop screens, hole-digging screens, and the like have appeared one after another. Although forms of these full screens increase the screen-to-body ratios, they are not full screens in a full sense. Therefore, a screen with an under-screen camera is the best form of the full screen.

The under-screen camera refers to that the front camera is located below the screen and a display function of the screen is not affected. In a case where the front camera is not used, the screen above the front camera may still display images normally. Therefore, when seen from a side of a display surface, the screen with the under-screen camera will not have any camera hole, which truly achieves a full-screen display effect.

Some embodiments of the present disclosure provide a display apparatus. The display apparatus 01, as shown in FIG. 1, includes a display panel 1. Of course, the display apparatus may further include other components, for example, a circuit for providing electrical signals to the display panel to drive the display panel for display, and the circuit may be referred to as a control circuit, which may include a circuit board electrically connected to a light-emitting substrate and/or an integrated circuit (IC) electrically connected to a light-emitting substrate.

In some embodiments, the display apparatus may include a display or a product including a display. The display may be a flat panel display (FPD), a microdisplay, etc. Depending on whether the display can be bent or rolled, the display may be a flexible display or a normal display (which may be referred to as a rigid display). For example, the product including the display is a smart phone, a tablet computer, an outdoor electronic display screen, an automatic teller machines (ATM), etc.

Figure 16:
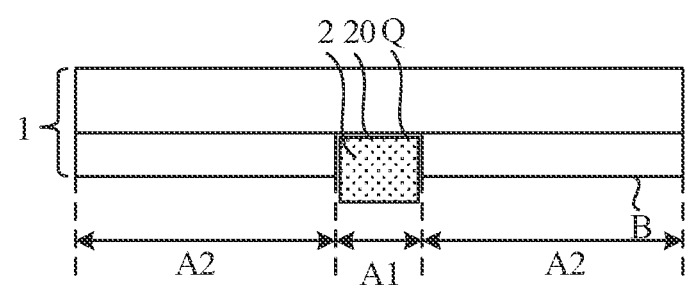
FIG. 16 is a sectional view showing a structure of a display apparatus, in accordance with some embodiments.

In some embodiments, as shown in FIG. 1, the above display panel 1 has a display region (also referred to as an active area) A, and the display region A includes a first display region A1 and a second display region A2. A light transmittance of the first display region A1 is greater than a light transmittance of the second display region A2. The display apparatus further includes a photosensitive element 2. For example, the photosensitive element 2 may be a camera, and the photosensitive element 2 is disposed at a position of the display panel 1 corresponding to the first display region A1 and on a side of the display panel 1 facing away from a light-exiting surface of the display panel 1. As shown in FIG. 16, the photosensitive element 2 includes a photosensitive portion 20, and the photosensitive portion 20 faces the light-exiting surface of the display panel 1.

The light transmittance is a percentage of a luminous flux of light passing through a transparent or semitransparent body to a luminous flux of incident light. Since the light transmittance of the first display region A1 is greater than the light transmittance of the second display region A2, the photosensitive element 2 is provided at the position of the display panel 1 corresponding to the first display region A1 and on the side of the display panel 1 facing away from the light-exiting surface of the display panel 1, so that the photosensitive element 2 may receive external light well. In this way, it may avoid an influence on the light entering the photosensitive element 2, and in turn improve a photographing effect well. In a case where the photosensitive element 2 is not used, the first display region A1 above the photosensitive element 2 may display images normally.

It will be noted that the photosensitive element 2 may, for example, be an under-screen camera. In this case, the first display region A1 may be used to provide the under-screen camera therein, and the second display region A2 is used to display images. Therefore, in the following embodiments, the first display region A1 may also be referred to as an under-screen camera region, and the second display region A2 may be referred to as a normal display region.

In some embodiments, as shown in FIG. 16, the display panel 1 is provided with a hole Q on a back B of the display panel 1 and at a position of the display panel 1 corresponding to the first display region A1. The photosensitive element 2 is disposed in the hole Q.

Figure 2:
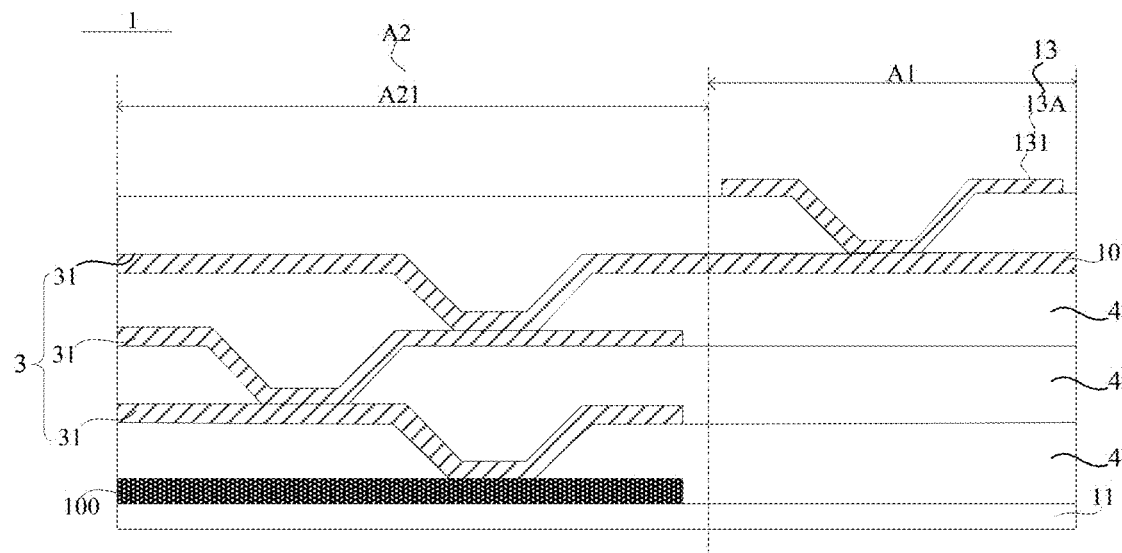
FIG. 2 is a diagram showing a connection relationship among conductive pattern layers of an electrical connection pattern in a display panel in the related art.
Figure 13:
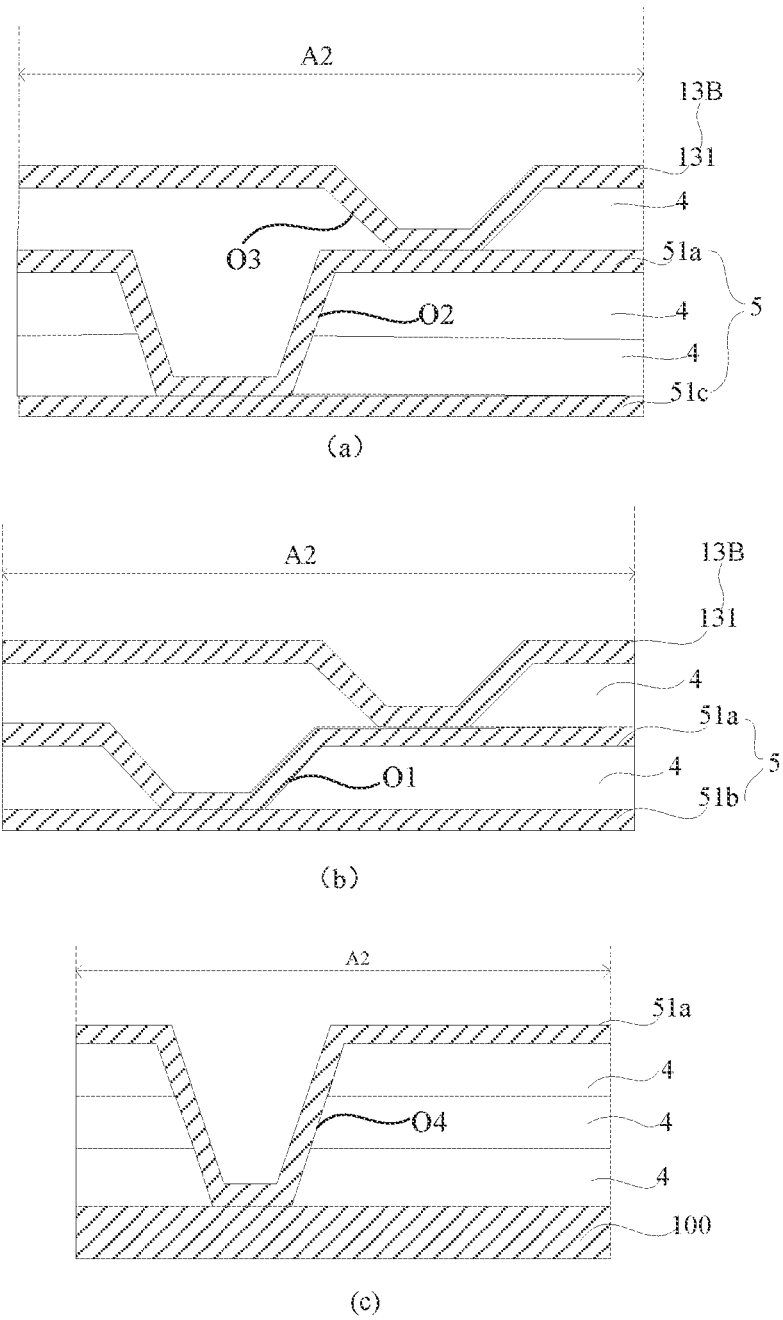
FIG. 13 is diagrams each showing a connection relationship among conductive pattern layers in an electrical connection pattern, in a display panel, for connecting a second light-emitting device and a pixel driving circuit in accordance with some embodiments.

In order to achieve a good photographing effect of the above under-screen camera and a display effect of the screen, in some embodiments, as shown in FIG. 2, the display panel 1 includes a substrate 11, a plurality of light-emitting devices 13 disposed on the substrate 11 and located in the first display region A1, and a plurality of pixel driving circuits 100 disposed on the substrate 11 and located in the second display region A2. Each light-emitting device 13 is coupled to a pixel driving circuit 100 through a group of electrical connection patterns 3. Here, it will be noted that each light-emitting device 13 located in the first display region A1 may be denoted as a first light-emitting device 13A. The display panel 1 may include, as shown in FIG. 13, in addition to the first light-emitting device 13A, a plurality of second light-emitting devices 13B located in the second display region A2. The plurality of first light-emitting devices 13A in the first display region A1 may be coupled to a part of the plurality of pixel driving circuits 100 in a one-to-one correspondence, and the plurality of second light-emitting devices in the second display region A2 are coupled to another part of the plurality of pixel driving circuits 100 in a one-to-one correspondence.

That is, the pixel driving circuit 100 corresponding to each light-emitting device 13 located in the first display region A1 is disposed in the second display region A2. By reducing the size of each pixel driving circuit 100, each pixel driving circuit 100 may drive a respective light-emitting device 13 to emit light without changing the pixel density (i.e., pixels per inch, PPI). In this way, it is also possible to avoid the influence on the light transmittance of the first display region A1 when the pixel driving circuit 100 is located in the first display region A1, thereby increasing the light transmittance of the first display region A1 and improving the photographing effect.

Based on the above structure, the pixel driving circuit 100 for driving each light-emitting device 13 located in the first display region A1 is provided in the second display region A2. For the display design of the under-screen camera, a low PPI technology where the PPI is lower than the PPI of normal display has been developed to a current technology where the display region where the under-screen camera is located (i.e., the above first display region A1) has the same PPI as the normal display region, PPI represents the number of pixels per inch. Therefore, the higher the PPI value, the higher the density at which the display screen can display images.

With the increase of PPI, in order to ensure a high light transmittance of the under-screen camera region, more transparent lines and insulating layers are required for the display design of the under-screen camera region, which needs more mask cost.

Figure 3:
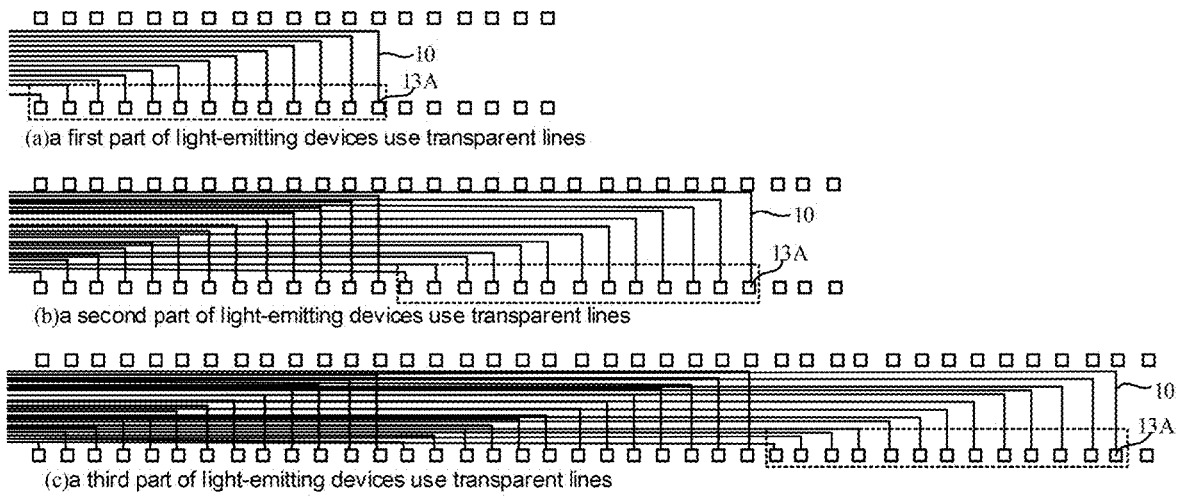
FIG. 3 is a diagram showing a structure in which each light-emitting device located in a first display region in a display panel is coupled to a pixel driving circuit through a transparent line, in accordance with some embodiments.
Figure 4:
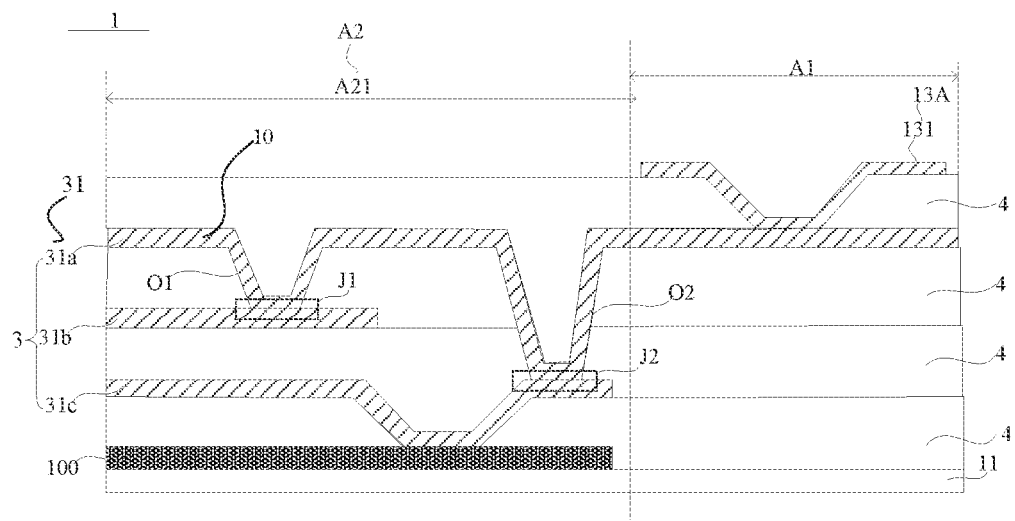
FIG. 4 is a diagram showing a connection relationship among conductive pattern layers of an electrical connection pattern in a display panel, in accordance with some embodiments.

In some embodiments, as shown in FIGS. 3 and 4, each conductive pattern layer 31 in each group of electrical connection patterns 3 is a transparent conductive layer, such as indium tin oxide (ITO). Each group of electrical connection patterns 3 include a transparent line 10 located in both the first display region A1 and the second display region A2. The transparent line 10 is any of the at least three conductive pattern layers 31. Remaining conductive pattern layers 31 except the transparent line 10 in each group of electrical connection patterns 3 are located in the first display region A1 or the second display region A2.

FIG. 3 is a diagram showing a structure in which each first light-emitting device 13A located in the under-screen camera region is coupled to a pixel driving circuit located in the normal display region through a transparent line 10 in the current design of the under-screen camera region of 400 to 450 PPI. It can be seen from FIG. 3 that the plurality of first light-emitting devices 13A located in the first display region A1 may be divided into several parts, and as shown in (a), (b) and (c) of FIG. 3, the plurality of first light-emitting devices 13A include a first part of light-emitting devices 13A, a second part of light-emitting devices 13A and a third part of light-emitting devices 13A. The first part of light-emitting devices 13A, the second part of light-emitting devices 13A and the third part of light-emitting devices 13A are coupled to their corresponding pixel driving circuits respectively through transparent lines 10 located in different layers. In combination with FIGS. 1, 2 and 3, the pixel driving circuit 100 for driving each first light-emitting device 13A may be disposed at a position of the second display region A2 proximate to the first display region A1, as shown in FIG. 1, located in the region shown in A21. In combination with FIGS. 1, 2 and 3, as the PPI increases, the number of the transparent lines 10 to be used depends on the size and the PPI of the under-screen camera region and a distance between transparent lines 10 determine.

For example, in the current technology of the under-screen camera region of 400 to 450 PPI, compared with a design of normal display, as shown in FIGS. 2 and 4, at least three layers of transparent lines 10 and three insulating layers 4 are required to be additionally provided. Each first light-emitting device 13A is coupled to a pixel driving circuit 100 corresponding to the first light-emitting device 13A through a group of electrical connection patterns 3, and each group of electrical connection patterns 3 include at least three conductive pattern layers 31 coupled to each other. The at least three conductive pattern layers 31 include a first conductive pattern layer 31a, a second conductive pattern layer 31b and a third conductive pattern layer 31c that are arranged in sequence in a direction proximate to the substrate, and an insulating layer 4 is provided between every two adjacent conductive pattern layers 31. The first conductive pattern layer 31a and the second conductive pattern layer 31b are adjacent, and the second conductive pattern layer 31b and the third conductive pattern layer 31c are adjacent or not adjacent.

The expression that the first conductive pattern layer 31a and the second conductive pattern layer 31b are adjacent means that the first conductive pattern layer 31a and the second conductive pattern layer 31b have no other conductive pattern layers 31 therebetween. The expression that the second conductive pattern layer 31b and the third conductive pattern layer 31c are adjacent means that the second conductive pattern layer 31b and the third conductive pattern layer 31c have no other conductive pattern layers 31 therebetween. The expression that the second conductive pattern layer 31b and the third conductive pattern layer 31c are not adjacent means that the second conductive pattern layer 31b and the third conductive pattern layer 31c have another conductive pattern layer 31 or other conductive pattern layers 31 therebetween.

Here, for example, the number of the at least three conductive pattern layers 31 is three (i.e., the at least three conductive pattern layers are the first conductive pattern layer 31a, the second conductive pattern layer 31b and the third conductive pattern layer 31c, respectively), the first conductive pattern layer 31a and the second conductive pattern layer 31b are adjacent to each other, and the second conductive pattern layer 31b and the third conductive pattern layer 31c are adjacent to each other. In the related art, a connection relationship between the light-emitting device 13 and the first conductive pattern layer 31a, the second conductive pattern layer 31b and the third conductive pattern layer 31c is shown in FIG. 2. It can be seen from FIG. 2 that during manufacturing, compared with the design of normal display in which only a single mask process for forming via hole(s) needs to be performed in the insulating layer(s) between the light-emitting device 13 and the pixel driving circuit 100, six additional mask processes (three mask processes of transparent lines and three mask processes of via holes in insulating layers) needs to be added. Such a great number of masks greatly increase the cost and factory production capacity, which has become an urgent problem to be solved in the production process of the current under-screen camera.

In light of this, in some embodiments, as shown in FIG. 4, an orthographic projection of the first conductive pattern layer 31a on the substrate 11 and an orthographic projection of the second conductive pattern layer 31b on the substrate 11 have a first overlapping region J1. The insulating layer 4 located between the first conductive pattern layer 31a and the second conductive pattern layer 31b is provided with a first via hole O1 extending through the insulating layer 4 in the first overlapping region J1, and the first conductive pattern layer 31a and the second conductive pattern layer 31b are coupled through the first via hole O1. An orthographic projection of the third conductive pattern layer 31c on the substrate 11 and the orthographic projection of the first conductive pattern layer 31a on the substrate 11 have a second overlapping region J2, and each conductive pattern layer 31 located between the first conductive pattern layer 31a and the third conductive pattern layer 31c is outside the second overlapping region J2. Multiple insulating layers 4 located between the first conductive pattern layer 31a and the third conductive pattern layer 31c are provided with a second via hole O2 extending through the multiple insulating layers 4 in the second overlapping region J2, and the first conductive pattern layer 31a and the third conductive pattern layer 31c are coupled through the second via hole O2.

In these embodiments, still consider an example in which the number of the at least three conductive pattern layers 31 is three, with reference to FIGS. 2 and 4, the first conductive pattern layer 31a is coupled to both the second conductive pattern layer 31b and the third conductive pattern layers 31c, so that the second conductive pattern layer 31b is coupled to the third conductive pattern layer 31c. Therefore, there is no need to provide a via hole, for coupling the second conductive pattern layer 31b and the third conductive pattern layer 31c, in the insulating layer 4 between the second conductive pattern layer 31b and the third conductive pattern layer 31c. During manufacturing, two mask processes for insulating layers may be merged into one mask process, so that the masks may be saved and the costs may be reduced.

Figure 5:
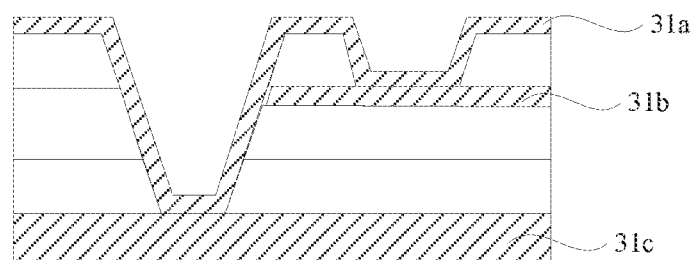
FIG. 5 is a diagram showing a connection relationship among a first conductive pattern layer, a second conductive pattern layer and a third conductive pattern layer of an electrical connection pattern in a display panel, in accordance with some embodiments.
Figure 6:
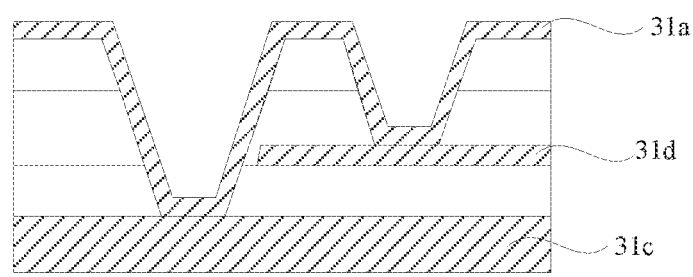
FIG. 6 is a diagram showing a connection relationship among a first conductive pattern layer, a fourth conductive pattern layer and a third conductive pattern layer of an electrical connection pattern in a display panel, in accordance with some embodiments.

In some embodiments, in combination with FIGS. 5 and 6, in a case where the second conductive pattern layer 31b and the third conductive pattern layer 31c are not adjacent, the at least three conductive pattern layers 31 further include a fourth conductive pattern layer 31d. The fourth conductive pattern layer 31d is located between the second conductive pattern layer 31b and the third conductive pattern layer 31c, and the fourth conductive pattern layer 31d is coupled to any conductive pattern layer 31 except the fourth conductive pattern layer 31d in the at least three conductive pattern layers 31.

In these embodiments, in combination with FIGS. 5 and 6, each group of electrical connection patterns 3 include the first conductive pattern layer 31a, the second conductive pattern layer 31b, the fourth conductive pattern layer 31d and the third conductive pattern layer 31c that are arranged in sequence in the direction proximate to the substrate. Since the first conductive pattern layer 31a, the second conductive pattern layer 31b and the third conductive pattern layer 31c are coupled to each other, the fourth conductive pattern layer 31d is coupled to any conductive pattern layer 31 except the fourth conductive pattern layer 31d in the at least three conductive pattern layers 31, so that the fourth conductive pattern layer 31d may be coupled to the first conductive pattern layer 31a, the second conductive pattern layer 31b and the third conductive pattern layer 31c. FIGS. 5 and 6 show a case where the fourth conductive pattern layer 31d is coupled to the first conductive pattern layer 31a.

The number of conductive pattern layers 31 between the second conductive pattern layer 31b and the third conductive pattern layer 31c may be one or more, which is not limited herein. The fourth conductive pattern layer 31d refers to any conductive pattern layer between the second conductive pattern layer 31b and the third conductive pattern layer 31c.

Figure 7:
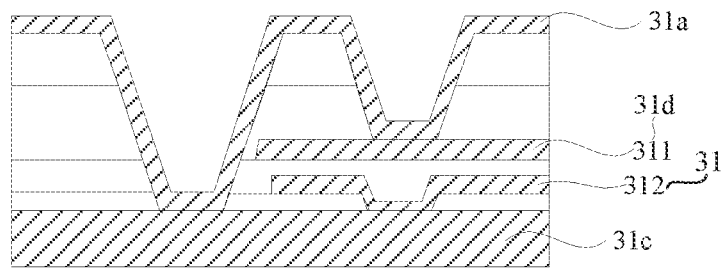
FIG. 7 is a diagram showing a connection relationship among a first conductive pattern layer, a conductive pattern layer I, a conductive pattern layer II, and a third conductive pattern layer of an electrical connection pattern in a display panel, in accordance with some embodiments.

For example, as shown in FIG. 7, the number of the conductive pattern layers 31 between the second conductive pattern layer 31b and the third conductive pattern layer 31c is two, and the fourth conductive pattern layer 31d is any of the two conductive pattern layers 31. Here, the two conductive pattern layers 31 are respectively denoted as a conductive pattern layer I 311 and a conductive pattern layer II 312. In this case, the conductive pattern layer I 311 may be coupled to any of the first conductive pattern layer 31a, the second conductive pattern layer 31b and the third conductive pattern layer 31c; and the conductive pattern layer II 312 may be coupled to any of the first conductive pattern layer 31a, the second conductive pattern layer 31b, the third conductive pattern layer 31c and the conductive pattern layer I 311. FIG. 7 shows a case where the fourth conductive pattern layer 31d is the conductive pattern layer I 311, the conductive pattern layer I 311 is coupled to the first conductive pattern layer 31a, and the conductive pattern layer II 312 is coupled to the third conductive pattern layer 31c.

It will be noted that, in the embodiments of the present disclosure, the remaining conductive pattern layers 31 except the transparent line 10 in each group of electrical connection patterns 3 may be located in the first display region A1 or the second display region A2, which means that the remaining conductive pattern layers 31 except the transparent line 10 in each group of electrical connection patterns 3 may be all located in the first display region A1 or all located in the second display region A2; alternatively, a part of the remaining conductive pattern layers 31 except the transparent line 10 in each group of electrical connection patterns 3 may be located in the first display region A1, and another part of the remaining conductive pattern layers 31 may be located in the second display region A2.

Figure 8:
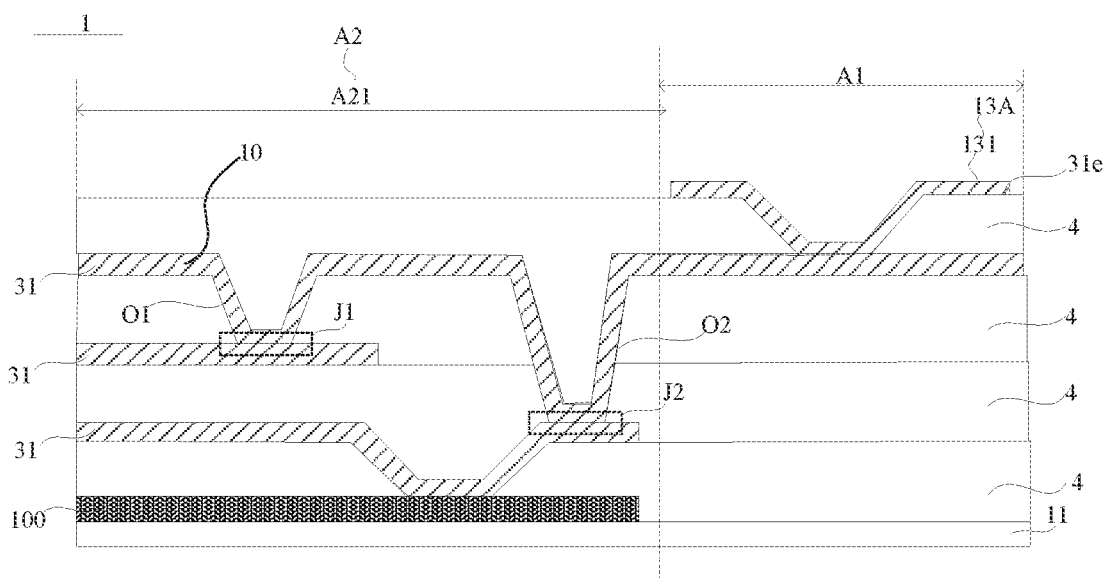
FIG. 8 is a diagram showing a connection relationship among conductive pattern layers of an electrical connection pattern in a display panel, a pixel driving circuit in the display panel, and a first electrode of a light-emitting device in the display panel, in accordance with some embodiments.
Figure 17:
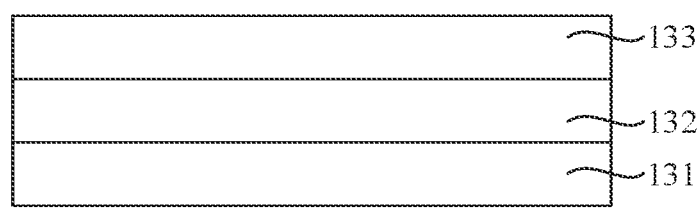
FIG. 17 is a diagram showing a structure of a light-emitting device, in accordance with some embodiments.

Thus, in some embodiments, as shown in FIGS. 8 and 17, each first light-emitting device 13A includes a first electrode 131, a light-emitting layer 132 and a second electrode 133 that are arranged sequentially in a direction away from the substrate 11. Each group of electrical connection patterns 3 include a fifth conductive pattern layer 31e, which is a conductive pattern layer 31 farthest from the substrate 11 among the at least three conductive pattern layers 31. The fifth conductive pattern layer 31e in each group of electrical connection patterns 3 is located in the first display region A1 and serves as the first electrode 131 of the first light-emitting device 13A, and each group of electrical connection patterns 3 are coupled to the pixel driving circuit 100 through any conductive pattern layer 31 located in the second display region A2. Alternatively, as shown in FIG. 4, each group of electrical connection patterns 3 are coupled to the first electrode 131 of the first light-emitting device 13A through any conductive pattern layer 31 located in the first display region A1, and coupled to the pixel driving circuit 100 through any conductive pattern layer 31 located in the second display region A2.

In these embodiments, in a first case, as shown in FIG. 8, the fifth conductive pattern layer 31e may serve as the first electrode 131 of the first light-emitting device 13A. In this case, the transparent line 10 may be any conductive pattern layer 31 except the fifth conductive pattern layer 31e in the at least three conductive pattern layers 31. In a second case, as shown in FIG. 4, each group of electrical connection patterns 3 are coupled to the first electrode 131 of the first light-emitting device 13A through any conductive pattern layer 31 located in the first display region A1, and coupled to the pixel driving circuit 100 through any conductive pattern layer 31 in the second display region A2.

Figure 9:
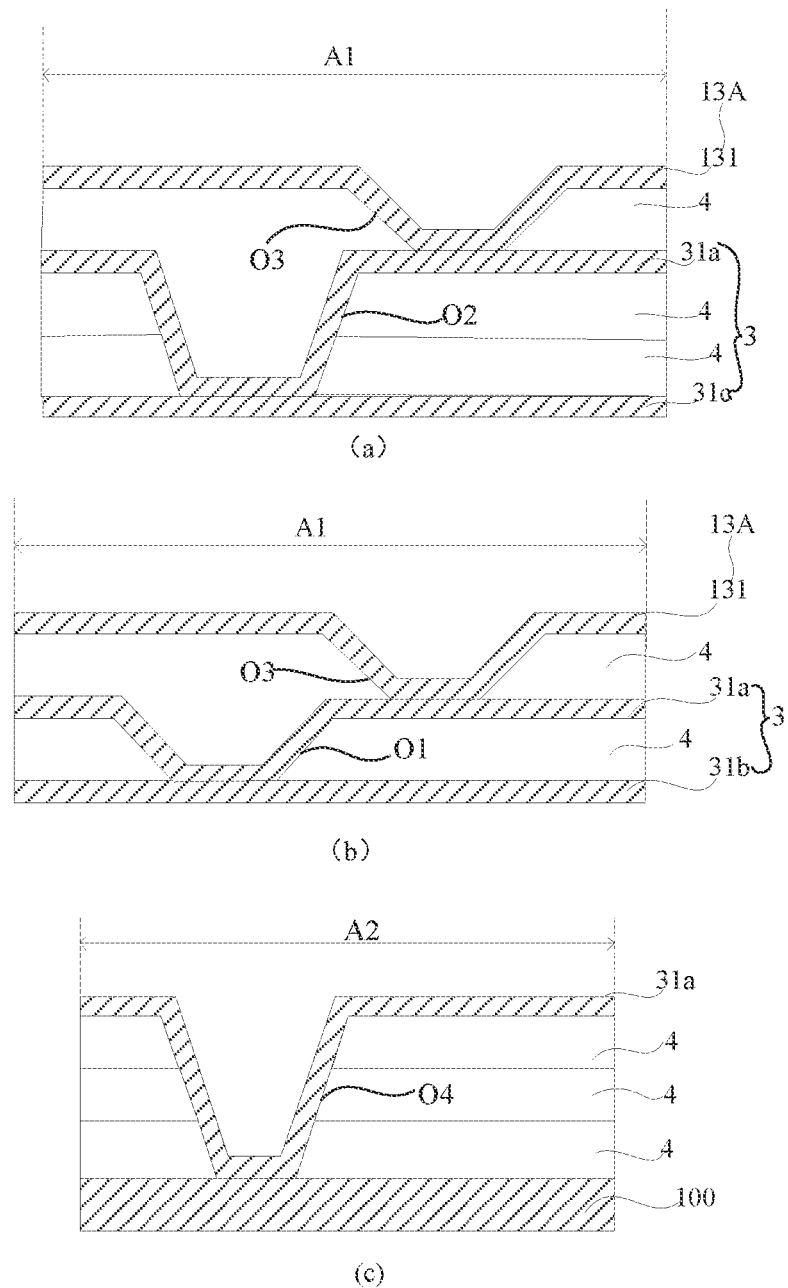
FIG. 9 is distribution diagrams each of via holes, located in different regions, of an electrical connection pattern in a display panel, in accordance with some embodiments.
Figure 10:
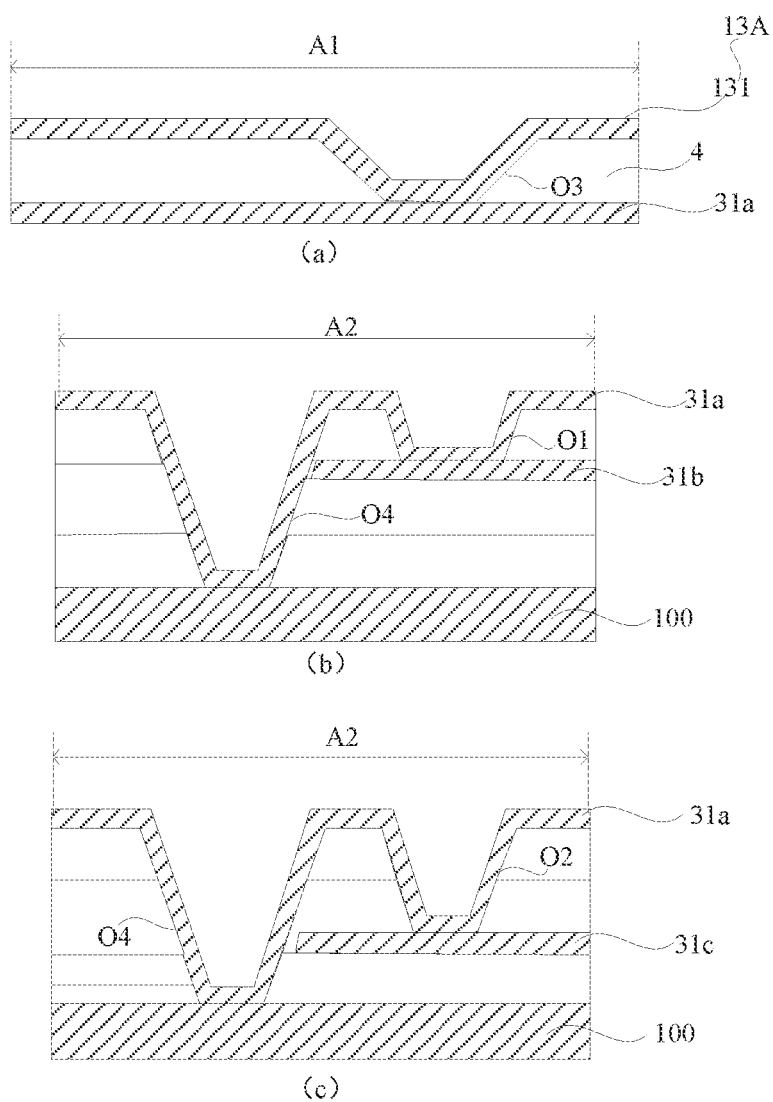
FIG. 10 is distribution diagrams each of via holes, located in different regions, of an electrical connection pattern in another display panel, in accordance with some embodiments.
Figure 11:
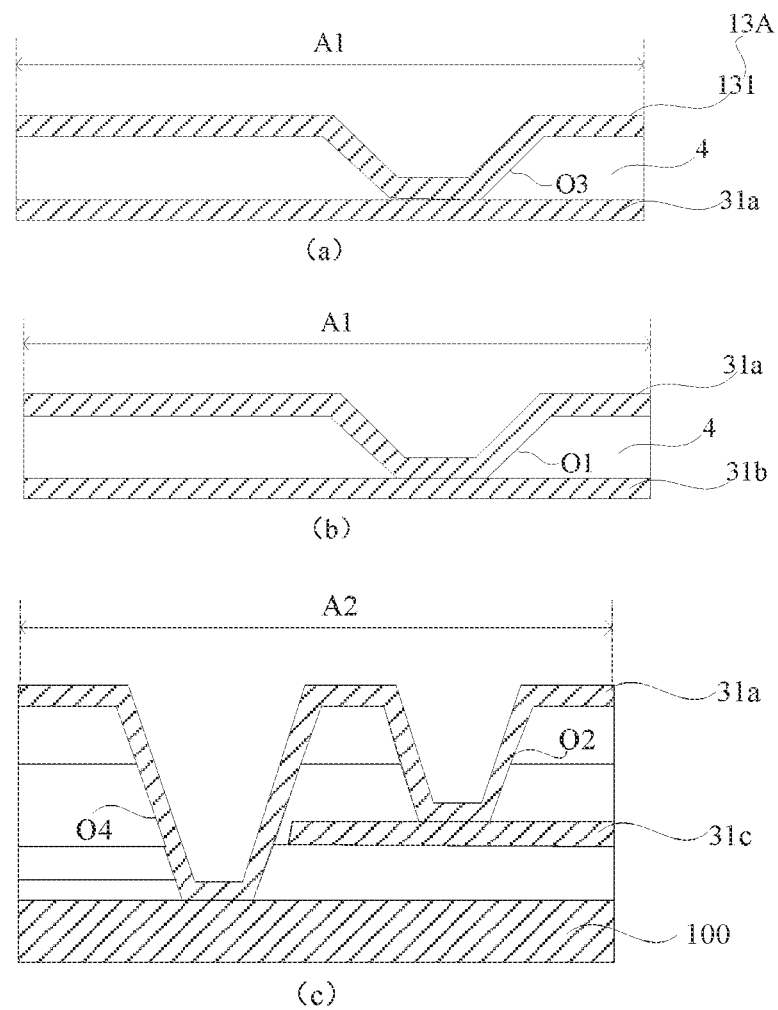
FIG. 11 is distribution diagrams each of via holes, located in different regions, of an electrical connection pattern in yet another display panel, in accordance with some embodiments.

In the second case, for example, each group of electrical connection patterns 3 include three conductive pattern layers (i.e., the first conductive pattern layer 31a, the second conductive pattern layer 31b and the third conductive pattern layer 31c), the first conductive pattern layer 31a is adjacent to the second conductive pattern layer 31b, the second conductive pattern layer 31b is adjacent to the third conductive pattern layer 31c, and the transparent line 10 is the first conductive pattern layer 31a. In a case where the remaining conductive pattern layers 31 except the transparent line 10 in each group of electrical connection patterns 3 are all located in the first display region A1, as shown in FIG. 9, the first via hole O1 between the first conductive pattern layer 31a and the second conductive pattern layer 31b in the group of electrical connection patterns 3 and the second via hole O2 between the first conductive pattern layer 31a and the third conductive pattern layer 31c in the group of electrical connection patterns 3 are both located in the first display region A1. In this case, as shown in (a), (b) and (c) in FIG. 9, the group of electrical connection patterns 3 may be coupled to the pixel driving circuit 100 through the first conductive pattern layer 31a, and coupled to the first light-emitting device 13A through the first conductive pattern layer 31a, the second conductive pattern layer 31b or the third conductive pattern layer 31c. As shown in (a) and (b) in FIG. 9, they show a case where the group of electrical connection patterns 3 are coupled to the first electrode 131 of the first light-emitting device 13A through the first conductive pattern layer 31a. In a case where the remaining conductive pattern layers 31 except the transparent line 10 in group of electrical connection patterns 3 are all located in the second display region A2, as shown in FIG. 10, the first via hole O1 between the first conductive pattern layer 31a and the second conductive pattern layer 31b in the group of electrical connection patterns 3 and the second via hole O2 between the first conductive pattern layer 31a and the third conductive pattern layer 31c in the group of electrical connection patterns are both located in the second display region A2. In this case, as shown in (b) and (c) in FIG. 10, the group of electrical connection patterns 3 may be coupled to the pixel driving circuit 100 through the first conductive pattern layer 31a, the second conductive pattern layer 31b or the third conductive pattern layer 31c, and as shown in (a) in FIG. 10, coupled to the first light-emitting device 13A through the first conductive pattern layer 31 a. In a case where a part of conductive pattern layers (e.g., the second conductive pattern layer 31b) in the remaining conductive pattern layers 31 except the transparent line 10 in each group of electrical connection patterns 3 are located in the first display region A1, and another part of conductive pattern layers (e.g., the third conductive pattern layer 31c) are located in the second display region A2, as shown in FIG. 11, the first via hole O1 between the first conductive pattern layer 31a and the second conductive pattern layer 31b in the group of electrical connection patterns 3 is located in the first display region A1, and the second via hole O2 between the first conductive pattern layer 31a and the third conductive pattern layer 31c in the group of electrical connection patterns 3 is located in the second display region A2. In this case, as shown in (c) in FIG. 11, the group of electrical connection patterns 3 may be coupled to the pixel driving circuit 100 through the first conductive pattern layer 31a or the third conductive pattern layer 31c, and as shown in (a) and (b) in FIG. 11, coupled to the first electrode 131 of the first light-emitting device 13A through the first conductive pattern layer 31a or the second conductive pattern layer 31b.

In these embodiments, each group of electrical connection patterns 3 are coupled to the first electrode 131 of the first light-emitting device 13A through any conductive pattern layer 31 located in the first display region A1, and coupled to the pixel driving circuit 100 through any conductive pattern layer 31 located in the second display region A2. It is also possible to provide a via hole extending through each insulating layer 4 in two or more insulating layers 4 (e.g., the via hole O4 shown in (c) in FIG. 9, (b) and (c) in FIG. 10, and (c) in FIG. 11, and the via hole O3 shown in (a) and (b) in FIG. 9, (a) in FIG. 10, and (a) in FIG. 11), so as to achieve coupling of the group of electrical connection patterns 3 to both the pixel driving circuit 100 and the first electrode 131 of the first light-emitting device 13A. Of course, only an example is described in which the via hole O4 provided in the second display region A2 for communicating the group of electrical connection patterns 3 and the pixel driving circuit 100 extends through two or more insulating layers 4, and the via hole O3 provided in the first display region A1 for communicating the group of electrical connection patterns 3 and the first electrode 131 of the first light-emitting device 13A extends through one insulating layer 4. It will be understood by those skilled in the art that the via hole O3 for communicating the group of electrical connection patterns 3 and the first electrode 131 of the first light-emitting device 13A may also be provided in the first display region A1, and the via hole O3 is made to extend through two or more insulating layers 4, so as to achieve the coupling of the group of electrical connection patterns 3 to the first electrode 131 of the first light-emitting device 13A.

In addition, in these embodiments, as shown in FIG. 4, the remaining conductive pattern layers 31 except the transparent line 10 in each group of electrical connection patterns 3 only occupy little space in the first display region A1 or in the second display region A2, which may avoid introducing too many transparent lines 10 in the first display region A1. Moreover, in combination with FIGS. 3 and 4, in a case where the remaining conductive patterns except the transparent line 10 in the at least three conductive pattern layers 31 are all located in the second display region A2, it is further possible to keep a large distance between each layer of transparent lines 10 located in the first display region A1 in a case where the number of layers of the transparent lines 10 is large.

Figure 12:
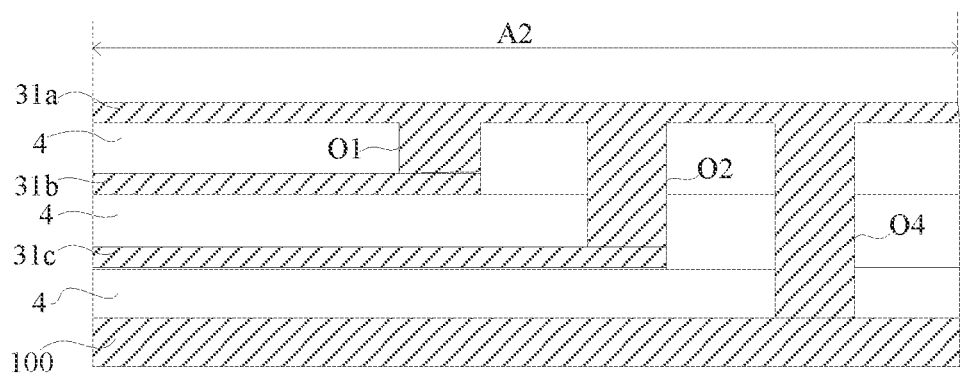
FIG. 12 is a diagram showing a connection relationship among a first conductive pattern layer, a second conductive pattern layer, a third conductive pattern layer of an electrical connection pattern and a pixel driving circuit in a display panel, in accordance with some embodiments.

As shown in FIG. 12, it shows a structural diagram in which the at least three conductive pattern layers 31 include the first conductive pattern layer 31a, the second conductive pattern layer 31b and the third conductive pattern layer 31c, the first conductive pattern layer 31a is adjacent to the second conductive pattern layer 31b, the second conductive pattern layer 31b is adjacent to the third conductive pattern layer 31c, the first conductive pattern layer 31a is coupled to the second conductive pattern layer 31b through the first via hole O1, the first conductive pattern layer 31a is coupled to the third conductive pattern layer 31c through the second via hole O2, and the pixel driving circuit 100 is coupled to the first conductive pattern layer 31a through the via hole O4. It can be seen in combination with FIGS. 2 and 12 that during manufacturing, three mask processes for forming via holes in the insulating layers may be merged into one mask process, thereby reducing the number of mask processes that need to be added from six to four, which may greatly reduce manufacturing cost and make the under-screen camera more suitable for mass production.

In some embodiments, as shown in (a), (b) and (c) in FIG. 13, each second light-emitting device 13B is coupled to the pixel driving circuit 100 through another group of electrical connection patterns 5. All conductive pattern layer 51 in the group of electrical connection patterns 5 are located in the second display region A2, and a connection manner of the group of electrical connection patterns 5 may, as shown in FIG. 13, be similar to the connection manner of the group of electrical connection patterns 3 described above. That is, in the second display region A2, the group of electrical connection patterns include a first conductive pattern layer 51a, a second conductive pattern layer 51b and a conductive pattern layer 51c, the first conductive pattern layer 51a is coupled to the second conductive pattern layer 51b through a first via hole O1, the first conductive pattern layer 51a is coupled to the third conductive pattern layer 51c through a second via hole O2, and the pixel driving circuit 100 is coupled to the first conductive pattern layer 51a through a via hole O4. As a result, it may also reduce the mask manufacturing cost.

Figure 14:
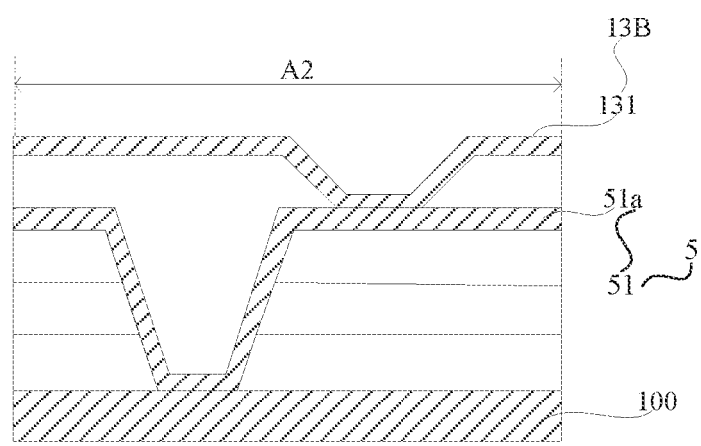
FIG. 14 is a diagram showing a connection relationship among a second light-emitting device, a pixel driving circuit and an electrical connection pattern in a display panel, in accordance with some embodiments.

In some other embodiments, the display panel 1 may further include a plurality of groups of electrical connection patterns 5 disposed in the second display region A2. As shown in FIG. 14, the number of conductive pattern layers 51 in each group of electrical connection patterns 5 may be less than the number of the conductive pattern layers 31 in the group of electrical connection patterns 3 described above. In this case, in a first example, the connection manner of the group of electrical connection patterns 5 may be the same as the connection manner of the group of electrical connection patterns 3 described above. That is, as shown in FIG. 13, at least two conductive pattern layers 51 are coupled to a conductive pattern layer 51 located above the at least two conductive pattern layers 51, so as to reduce the mask manufacturing process. In a second example, as shown in FIG. 14, it shows a case that the group of electrical connection patterns 5 only include the first conductive pattern layer 51a, and the first conductive pattern layer 51a is in the same layer as the first conductive pattern layer 31a in the group of electrical connection patterns 3 described above. By reducing the number of the conductive pattern layers 51 in the group of electrical connection patterns 5, and forming via holes in multiple insulating layers 4 to directly couple two non-adjacent conductive pattern layers 51, the mask processes may also be reduced.

Figure 15:
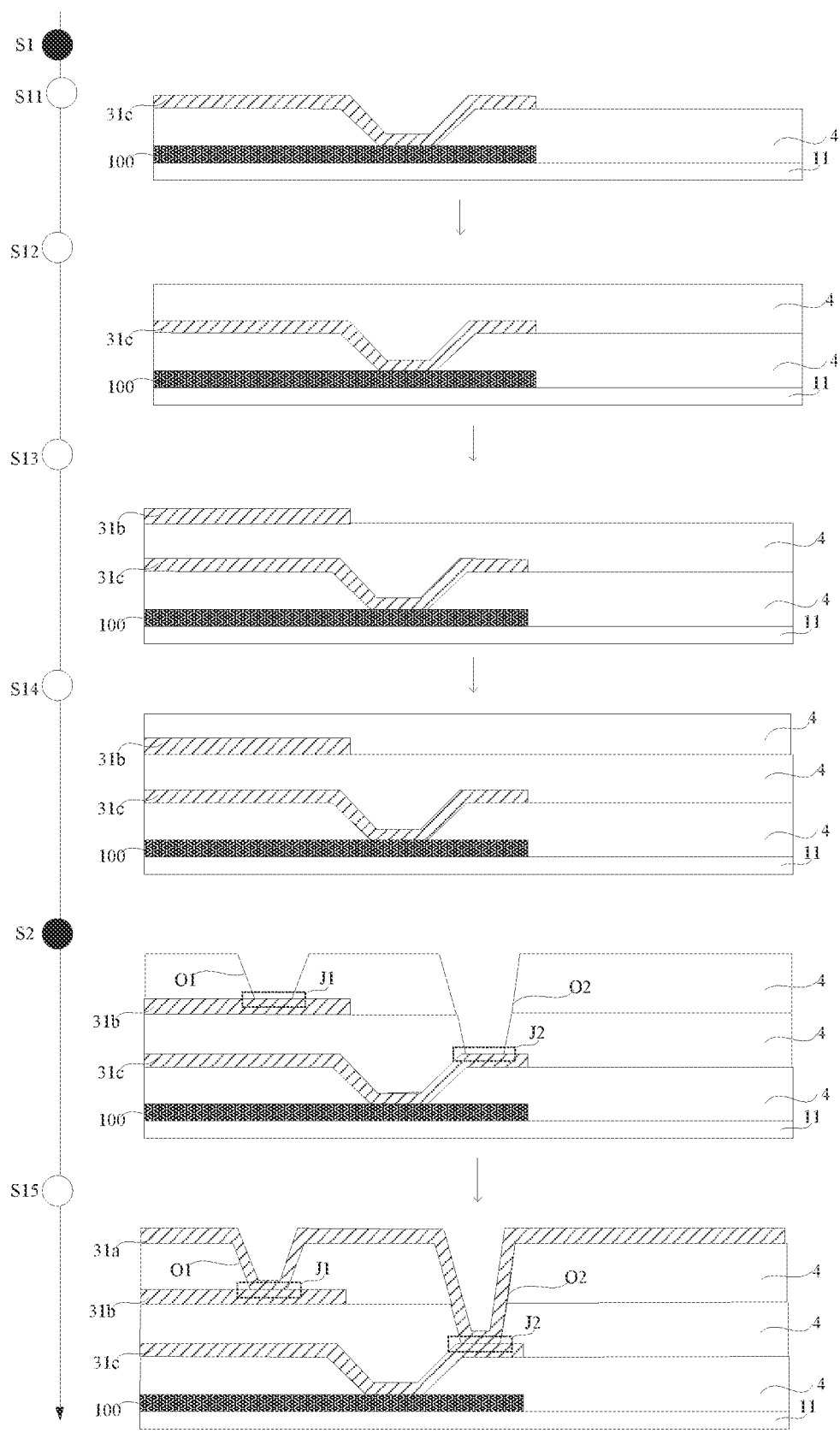
FIG. 15 is a flow diagram of a method for manufacturing an electrical connection pattern, in accordance with some embodiments.

Some embodiments of the present disclosure provide a method for manufacturing the display panel described above, and the method includes:

forming a plurality of groups of electrical connection patterns 3 on the substrate, as shown in FIG. 15, which includes S1 and S2.

In S1, the at least three conductive pattern layers including the third conductive pattern layer 31c, the second conductive pattern layer 31b and the first conductive pattern layer 31a are formed in sequence on the substrate 11, and the insulating layer 4 between every two adjacent conductive pattern layers 31 is formed on the substrate 11. The orthographic projection of the second conductive pattern layer 31b on the substrate 11 and the orthographic projection of the first conductive pattern layer 31a on the substrate 11 have the first overlapping region J1, and the orthographic projection of the third conductive pattern layer 31c on the substrate 11 and the orthographic projection of the first conductive pattern layer 31a on the substrate 11 have the second overlapping region J2, and each conductive pattern layer 31 located between the third conductive pattern layer 31c and the first conductive pattern layer 31a is outside the second overlapping region J2.

Here, for example, the number of the at least three conductive pattern layers is three, the first conductive pattern layer 31a is adjacent to the second conductive pattern layer 31b, and the second conductive pattern layer 31a is adjacent to the third conductive pattern layer 31c. Forming the third conductive pattern layer 31c, the second conductive pattern layer 31b, the first conductive pattern layer 31a, and the insulating layers 4 each located between every two adjacent conductive pattern layers 31 on the substrate 11 may include:

forming the third conductive pattern layer 31c, a first insulating layer 4, the second conductive pattern layer 31b, a second insulating layer 4 and the first conductive pattern layer 31a sequentially on the substrate 11 (the substrate 11 may be a substrate on which the pixel driving circuits 100 have been formed), which includes S11 to S15.

In S11, the third conductive pattern layer 31c is formed on the substrate 11.

In S12, the first insulating layer 4 is formed on the substrate 11 on which the third conductive pattern layer 31c has been formed.

In S13, the second conductive pattern layer 31b is formed on the substrate 11 on which the first insulating layer 4 has been formed.

In S14, the second insulating layer 4 is formed on the substrate 11 on which the second conductive pattern layer 31b has been formed.

In S15, the first conductive pattern layer 31a is formed on the substrate 11 on which the second insulating layer 4 has been formed.

The third conductive pattern layer 31c, the second conductive pattern layer 31b and the first conductive pattern layer 31a are each formed by a single mask process.

In S2, through a same patterning process, the first via hole O1 extending through the insulating layer 4 and located in the first overlapping region J1 is formed in the insulating layer 4 between the first conductive pattern layer 31a and the second conductive pattern layer 31b, and the second via hole O2 extending through the multiple insulating layers 4 and located in the second overlapping region J2 is formed in the multiple insulating layers 4 between the first conductive pattern layer 31a and the third conductive pattern layer 31c. The first conductive pattern layer 31a and the second conductive pattern layer 31b are coupled through the first via hole O1, and the first conductive pattern layer 31a and the third conductive pattern layer 31c are coupled through the second via hole O2.

S2 in which through the same patterning process, the first via hole O1 extending through the insulating layer 4 and located in the first overlapping region J1 is formed in the insulating layer 4 between the first conductive pattern layer 31a and the second conductive pattern layer 31b, and the second via hole O2 extending through the multiple insulating layers 4 and located in the second overlapping region J2 is formed in the multiple insulating layers 4 between the first conductive pattern layer 31a and the third conductive pattern layer 31c may be performed after S14 of forming the second insulating layer 4 on the substrate 11 on which the second conductive pattern layer 31b has been formed, and before S15 of forming the first conductive pattern layer 31a on the substrate 11 on which the second insulating layer 4 has been formed.

It can be seen that, in a case of manufacturing the group of electrical connection patterns 3, the two processes of forming via holes in the insulating layers 4 in the related art may be merged into one process, so that the manufacturing cost may be reduced.

In some embodiments, in a case where the display panel 1 has the display region A, and the display region A includes the first display region A1 and the second display region A2, forming the plurality of groups of electrical connection patterns 3 on the substrate 11, includes:

forming each conductive pattern layer 31 on the substrate 11. As shown in FIGS. 3 and 4, each group of electrical connection patterns 3 include a transparent line 10 located in both the first display region A1 and the second display region A2, and the transparent line 10 is any of the at least three conductive pattern layers 31. The remaining conductive pattern layers 31 except the transparent line 10 in each group of electrical connection patterns 3 are located in the first display region A1 or in the second display region A2.

In these embodiments, each group of electrical connection patterns 3 may be coupled to the first electrode 131 of the first light-emitting device 13A through any conductive pattern layer 31 located in the first display region A1, and coupled to the pixel driving circuit 100 through any conductive pattern layer 31 located in the second display region A2. Likewise, a via hole extending through each of the two or more insulating layer 4 (e.g., the via hole O4 in (c) in FIG. 9, (b) and (c) in FIG. 10, and (c) in FIG. 11, and the via hole O3 in (a) and (b) in FIG. 9, (a) in FIG. 10, and (a) in FIG. 11) may be provided in the two or more insulating layers 4, so as to achieve the coupling of the group of electrical connection patterns 3 to the pixel driving circuit 100 and the first electrode 131 of the first light-emitting device 13A. Of course, only an example is described in which the via hole O4 provided in the second display region A2 for communicating the group of electrical connection patterns 3 and the pixel driving circuit 100 extends through two or more insulating layers 4, and the via hole O3 provided in the first display region A1 for communicating the group of electrical connection patterns 3 and the first electrode 131 of the first light-emitting device 13A extends through one insulating layer 4. It will be understood by those skilled in the art that the via hole O3 for communicating the group of electrical connection patterns 3 and the first electrode 131 of the first light-emitting device 13A may also be provided in the first display region A1, and the via hole O3 is made to extend through two or more insulating layers 4, so as to achieve the coupling of the group of electrical connection patterns 3 to the first electrode 131 of the first light-emitting device 13A.

In addition, as shown in FIG. 4, the remaining conductive pattern layers 31 except the transparent line 10 in each group of electrical connection patterns 3 only occupy little space in the first display region A1 or in the second display region A2, which may avoid introducing too many transparent lines 10 in the first display region A1. Moreover, in combination with FIGS. 3 and 4, in a case where the remaining conductive patterns 31 except the transparent line 10 in the at least three conductive pattern layers 31 are all located in the second display region A2, it is further possible to keep a large distance between each layer of transparent lines 10 located in the first display region A1 in a case where the number of layers of the transparent lines 10 is large.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:
   a substrate;
   a plurality of groups of electrical connection patterns disposed on the substrate; and
   a plurality of insulating layers, wherein
   each group of electrical connection patterns include at least three conductive pattern layers that are coupled to each other;
   the at least three conductive pattern layers include a first conductive pattern layer, a second conductive pattern layer and a third conductive pattern layer that are arranged sequentially in a direction proximate to the substrate; every two adjacent conductive pattern layers are provided with an insulating layer in the plurality of insulating layers therebetween;
   an orthographic projection of the first conductive pattern layer on the substrate and an orthographic projection of the second conductive pattern layer on the substrate have a first overlapping region; an insulating layer located between the first conductive pattern layer and the second conductive pattern layer is provided with a first via hole extending through the insulating layer in the first overlapping region, and the second conductive pattern layer and the first conductive pattern layer are coupled through the first via hole; and
   an orthographic projection of the third conductive pattern layer on the substrate and the orthographic projection of the first conductive pattern layer on the substrate have a second overlapping region; each conductive pattern layer between the first conductive pattern layer and the third conductive pattern layer is outside the second overlapping region; multiple insulating layers located between the first conductive pattern layer and the third conductive pattern layer are provided with a second via hole extending through the multiple insulating layers in the second overlapping region, and the first conductive pattern layer and the third conductive pattern layer are coupled through the second via hole;
   wherein the at least three conductive pattern layers further include at least two conductive pattern layers located between the second conductive pattern layer and the third conductive pattern layer; one of the at least two conductive pattern layers is coupled to a conductive pattern layer except the at least two conductive pattern layers in the at least three conductive pattern layers, and another of the at least two conductive pattern layers is coupled to another conductive pattern layer except the at least two conductive pattern layers in the at least three conductive pattern layers.

2. The display panel according to claim 1, wherein the at least three conductive pattern layers further include a fourth conductive pattern layer; the fourth conductive pattern layer is located between the second conductive pattern layer and the third conductive pattern layer, and the fourth conductive pattern layer is coupled to any conductive pattern layer except the fourth conductive pattern layer in the at least three conductive pattern layers.

3. The display panel according to claim 1, wherein
   the display panel has a display region, the display region includes a first display region and a second display region, and a light transmittance of the first display region is greater than a light transmittance of the second display region;
   the display panel further comprises: a plurality of first light-emitting devices disposed on the substrate and located in the first display region, and a plurality of pixel driving circuits disposed on the substrate and located in the second display region;
   each first light-emitting device is coupled to a pixel driving circuit in the plurality of pixel driving circuits through a group of electrical connection patterns.

4. The display panel according to claim 3, wherein each first light-emitting device includes a first electrode, a light-emitting layer and a second electrode that are sequentially arranged in a direction away from the substrate.

5. The display panel according to claim 4, wherein
   each group of electrical connection patterns further include a fifth conductive pattern layer, and the fifth conductive pattern layer is a conductive pattern layer farthest from the substrate in the at least three conductive pattern layers; the fifth conductive pattern layer in each group of electrical connection patterns is located in the first display region and serves as a first electrode of a first light-emitting device, and each group of electrical connection patterns are coupled to a pixel driving circuit through any conductive pattern layer located in the second display region.

6. The display panel according to claim 4, wherein each group of electrical connection patterns are coupled to a first electrode of a first light-emitting device through any conductive pattern layer located in the first display region, and coupled to a pixel driving circuit through any conductive pattern layer located in the second display region.

7. The display panel according to claim 3, wherein each conductive pattern layer in each group of electrical connection patterns is a transparent conductive layer; one of the at least three conductive pattern layers is a transparent line located in both the first display region and the second display region, and remaining conductive pattern layers except the transparent line in each group of electrical connection patterns are each located in the first display region or in the second display region.

8. The display panel according to claim 3, further comprising a plurality of second light-emitting devices disposed on the substrate and located in the second display region, wherein
   each second light-emitting device is coupled to a pixel driving circuit in the plurality of pixel driving circuits through a group of electrical connection patterns located in the second display region.

9. A display apparatus, comprising the display panel according to claim 1.

10. The display apparatus according to claim 9, wherein the display panel has a display region, and the display region includes a first display region and a second display region;

the display apparatus further comprises a photosensitive element;

the photosensitive element is disposed at a position of the display panel corresponding to the first display region and located on a side of the display panel facing away from a light-exiting surface of the display panel, and the photosensitive element includes a photosensitive portion that faces the light-exiting surface of the display panel.

11. The display apparatus according to claim 10, wherein the display panel is provided with a hole on a back of the display panel and at a position of the display panel corresponding to the first display region, and the photosensitive element is disposed in the hole.

12. The display apparatus according to claim 10, wherein the photosensitive element includes a camera.

13. A method for manufacturing the display panel according to claim 1, the method comprising:

forming the plurality of groups of electrical connection patterns and the plurality of insulating layers on the substrate, which includes:

forming the at least three conductive pattern layers including the third conductive pattern layer, the second conductive pattern layer, and the first conductive pattern layer sequentially on the substrate, and forming the insulating layer between every two adjacent conductive pattern layers on the substrate, wherein the orthographic projection of the second conductive pattern layer on the substrate and the orthographic projection of the first conductive pattern layer on the substrate have the first overlapping region, the orthographic projection of the third conductive pattern layer on the substrate and the orthographic projection of the first conductive pattern layer on the substrate have the second overlapping region, and each conductive pattern layer located between the third conductive pattern layer and the first conductive pattern layer is outside the second overlapping region; and through a same patterning process, forming the first via hole extending through the insulating layer and located in the first overlapping region in the insulating layer between the first conductive pattern layer and the second conductive pattern layer, and the second via hole extending through the multiple insulating layers and located in the second overlapping region in the multiple insulating layers between the first conductive pattern layer and the third conductive pattern layer, so that the first conductive pattern layer is coupled to the second conductive pattern layer through the first via hole, and the first conductive pattern layer is coupled to the third conductive pattern layer through the second via hole.

14. The method for manufacturing the display panel according to claim 13, wherein the display panel has a display region, and the display region includes a first display region and a second display region; forming the at least three conductive pattern layers including the third conductive pattern layer, the second conductive pattern layer, and the first conductive pattern layer sequentially on the substrate includes:

forming a transparent line in both the first display region and the second display region, the transparent line being any of the at least three conductive pattern layers, and forming remaining conductive pattern layers except the transparent line in the first display region or in the second display region.

15. The method for manufacturing the display panel according to claim 13, wherein through the same patterning process, forming the first via hole in the insulating layer between the first conductive pattern layer and the second conductive pattern layer, and the second via hole in the multiple insulating layers between the first conductive pattern layer and the third conductive pattern layer, includes:

after forming the insulating layer between the second conductive pattern layer and the first conductive pattern layer, through the same patterning process, forming the first via hole in the insulating layer between the first conductive pattern layer and the second conductive pattern layer, and the second via hole in the multiple insulating layers between the first conductive pattern layer and the third conductive pattern layer.

16. The method for manufacturing the display panel according to claim 13, wherein forming the plurality of groups of electrical connection patterns on the substrate, includes:

forming the plurality of groups of electrical connection patterns on the substrate on which a plurality of pixel driving circuits are formed.

17. The method for manufacturing the display panel according to claim 16, wherein the display panel has a display region, and the display region includes a first display region and a second display region; the method further comprises:

forming a first light-emitting device in the first display region and on a side of each group of electrical connection patterns away from the substrate, the first light-emitting device being coupled to a corresponding pixel driving circuit in the plurality of pixel driving circuits through the group of electrical connection patterns.

18. A display panel, comprising:

a substrate;

a plurality of groups of electrical connection patterns disposed on the substrate; and a plurality of insulating layers, wherein each group of electrical connection patterns include at least three conductive pattern layers that are coupled to each other;

the at least three conductive pattern layers include a first conductive pattern layer, a second conductive pattern layer and a third conductive pattern layer that are arranged sequentially in a direction proximate to the substrate; every two adjacent conductive pattern layers are provided with an insulating layer in the plurality of insulating layers therebetween;

an orthographic projection of the first conductive pattern layer on the substrate and an orthographic projection of the second conductive pattern layer on the substrate have a first overlapping region; an insulating layer located between the first conductive pattern layer and the second conductive pattern layer is provided with a first via hole extending through the insulating layer in the first overlapping region, and the second conductive pattern layer and the first conductive pattern layer are coupled through the first via hole;

an orthographic projection of the third conductive pattern layer on the substrate and the orthographic projection of the first conductive pattern layer on the substrate have a second overlapping region; each conductive pattern layer between the first conductive pattern layer and the third conductive pattern layer is outside the second overlapping region; multiple insulating layers located between the first conductive pattern layer and the third conductive pattern layer are provided with a second via hole extending through the multiple insulating layers in the second overlapping region, and the first conductive pattern layer and the third conductive pattern layer are coupled through the second via hole;

the display panel has a display region, the display region includes a first display region and a second display region, and a light transmittance of the first display region is greater than a light transmittance of the second display region;

the display panel further comprises: a plurality of first light-emitting devices disposed on the substrate and located in the first display region, and a plurality of pixel driving circuits disposed on the substrate and located in the second display region;

each first light-emitting device is coupled to a pixel driving circuit in the plurality of pixel driving circuits through a group of electrical connection patterns; and each conductive pattern layer in each group of electrical connection patterns is a transparent conductive layer; one of the at least three conductive pattern layers is a transparent line located in both the first display region and the second display region, and remaining conductive pattern layers except the transparent line in each group of electrical connection patterns are each located in the first display region or in the second display region.

* * * * *